United States Patent
Yu

(10) Patent No.: US 7,800,240 B2
(45) Date of Patent: Sep. 21, 2010

(54) UNDER BUMP METALLURGY STRUCTURE AND WAFER STRUCTURE USING THE SAME AND METHOD OF MANUFACTURING WAFER STRUCTURE

(75) Inventor: Jui-I Yu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 232 days.

(21) Appl. No.: 12/149,861

(22) Filed: May 9, 2008

(65) Prior Publication Data
US 2008/0308938 A1    Dec. 18, 2008

(30) Foreign Application Priority Data
Jun. 13, 2007    (TW)    ............... 96121429 A

(51) Int. Cl.
*H01L 23/52* (2006.01)
*H01L 23/48* (2006.01)
*H01L 29/40* (2006.01)

(52) U.S. Cl. ............ 257/781; 257/E23.021; 257/751; 257/780; 438/108; 438/614

(58) Field of Classification Search ......... 257/E21.506, 257/E23.017, E23.021, E23.069, 751, 778–781; 438/108, 612, 614
See application file for complete search history.

(56) References Cited

U.S. PATENT DOCUMENTS

| | | | |
|---|---|---|---|
| 6,028,011 A * | 2/2000 | Takase et al. ............... | 438/745 |
| 6,180,505 B1 * | 1/2001 | Uzoh ........................ | 438/614 |
| 6,548,898 B2 * | 4/2003 | Matsuki et al. ............. | 257/746 |
| 6,784,543 B2 * | 8/2004 | Matsuki et al. ............. | 257/746 |
| 7,078,796 B2 * | 7/2006 | Dunn et al. ................. | 257/690 |
| 2003/0222352 A1 * | 12/2003 | Kung et al. ................. | 257/772 |
| 2004/0080049 A1 * | 4/2004 | Kim ........................ | 257/750 |
| 2004/0113273 A1 * | 6/2004 | Chen et al. ................. | 257/737 |
| 2004/0222520 A1 * | 11/2004 | Jin ........................... | 257/737 |
| 2004/0238955 A1 * | 12/2004 | Homma et al. ............. | 257/737 |
| 2004/0262760 A1 * | 12/2004 | Huang ....................... | 257/751 |
| 2005/0001313 A1 * | 1/2005 | Yang ........................ | 257/734 |
| 2005/0001324 A1 | 1/2005 | Dunn et al. | |
| 2005/0104215 A1 * | 5/2005 | Kao et al. .................... | 257/751 |
| 2005/0167780 A1 * | 8/2005 | Edelstein et al. ............ | 257/531 |
| 2005/0186771 A1 * | 8/2005 | Tanida et al. ................ | 438/614 |
| 2006/0214296 A1 * | 9/2006 | Okamoto et al. ............ | 257/751 |

FOREIGN PATENT DOCUMENTS

| | | |
|---|---|---|
| CN | 1317389 A | 10/2001 |
| CN | 1681099 | 10/2005 |
| CN | 1701952 A | 11/2005 |

* cited by examiner

Primary Examiner—Chris Chu
(74) Attorney, Agent, or Firm—Bacon & Thomas, PLLC

(57) ABSTRACT

An under bump metallurgy structure and wafer structure using the same and method of manufacturing wafer structure are provided. The under bump metallurgy structure includes an adhesion layer, a barrier layer and a wetting layer. The adhesion layer is disposed on a bonding pad of a wafer. The barrier layer is disposed on the adhesion layer. The wetting layer is disposed on the barrier layer. The adhesion layer, the barrier layer and the wetting layer are respectively made of nickel with boron, cobalt and gold.

13 Claims, 3 Drawing Sheets

UNDER BUMP METALLURGY STRUCTURE AND WAFER STRUCTURE USING THE SAME AND METHOD OF MANUFACTURING WAFER STRUCTURE

This application claims the benefit of Taiwan application Serial No. 96121429, filed Jun. 13, 2007, the subject matter of which is incorporated herein by reference.

BACKGROUND OF THE INVENTION

1. Field of the Invention

The invention relates in general to an under bump metallurgy structure and a wafer structure using the same and a method of manufacturing the wafer structure, and more particularly to an under bump metallurgy structure formed by way of electroless plating and a wafer structure using the same and a method of manufacturing the wafer structure.

2. Description of the Related Art

Of the semiconductor packaging technologies, examples of most common chip bonding technologies include flip chip bonding, wire bonding and tape automated bonding. According to these chip bonding technologies, chips and substrates are electrically connected. The flip chip bonding technology uses a solder bump as an electrically connecting medium for the chip and the substrate. Compared with the wire bonding technology and the tape automated bonding technology, the flip chip bonding technology has shorter electrical path and better electrical connection quality. Therefore, the method of using solder bump in chip bonding has been widely adopted in the field of semiconductor packaging.

According to a well-known method of manufacturing bump, an under bump metallurgy (UBM) layer is formed on a chip surface first, and the UBM layer covers a copper solder pad on the chip surface. Normally, the under bump metallurgy layer is formed by way of sputtering or electroplating. Next, the photoresist layer is coated and a photo etching process is performed, so that the dimension of the under bump metallurgy layer substantially corresponds to that of the copper solder pad. Then, the photoresist layer is stripped, and the solder paste is printed on the UBM layer. After that, the solder paste undergoes a reflowing process to form the bump. In the reflowing process, the solder particles in the solder paste are liquidfied first, and then cooled off to solidify.

Owing to the complicated process steps of the above-described method of forming a bump, the cost of the manufacturing process can not be effectively reduced. Therefore, another method for forming bump without using photo etching process is provided. The method without photo etching includes the following steps. First, a nickel layer is electroless plated onto a copper solder pad, and a palladium layer is electroless plated onto the nickel layer. Then, a wetting layer, such as a gold layer, is formed. Afterwards, a bump is formed through the printing and reflowing processes. The process of electroless plating nickel is a chemical reduction which reduces and deposits nickel ions on the catalytic surface by a reductant (such as sodium hypophosphite) of the solution. In terms of the interface reaction, the electroless plated nickel has excellent property of shielding the diffusion of copper, and therefore is widely used as a diffusion barrier in the solder bump of electronic packaging. In the step of electroless plating a nickel layer, a wafer is immersed in a plating bath which provides nickel ions from nickel sulfate ($NiSO_4$) and uses sodium hypophosphite ($NaH_2PO_2$) as a reductant for reducing the nickel ions to nickel metal. An autocatalytic reaction by using the nickel metal as a catalytic agent is performed, so that a nickel with phosphorus layer (Ni—P) is plated onto the aluminum or copper solder pad. Such electroless plating process has the advantages of uniform layer thickness, low porosity, fine crystallization, robust hardness and good solderability. However, the electroless plating manufacturing process is susceptible to the factors such as the ingredients of the plating bath, concentration thereof, operating temperature and pH value. For example, during thermal manufacturing processes, such as reflowing the solder paste, a crystallized phosphorous-rich inter-metallic compound (IMC) is likely to form between the solder paste and the nickel layer. During the displacement reaction of electroless plating process, when a relative small nickel atom is dissolved (oxidized), two relative large gold atoms will be deposited (reduced), resulting in overall misalignment during the growth of lattice. As a result, the interface between nickel and gold generates many pores or may even contains liquid of plating bath, causing the nickel layer to be passivated and oxidized continually, which largely deteriorates the interface quality. Besides, when the nickel layer contains relative large amount of phosphorous, the solderability will be decreased. Therefore, the phosphorus contained in the nickel layer is normally controlled between 7~9%. An interface between a bump and a nickel with phosphorus layer is taken for example below. Please refer to FIG. 1 and attachment 1 at the same time. FIG. 1 is a perspective of the interface between a bump and an electroless plated nickel layer from the prior art. Attachment 1 is a scanning electron microscopy (SEM) photo of FIG. 1. According to the scanning electron microscopy (SEM) and the ingredient analysis, a crystallized phosphorous-rich inter-metallic compound 102 is formed between the bump 103 and the nickel with phosphorus layer 101. Owing to the brittleness of the inter-metallic compound 102, the connecting point between the bump 103 and the chip therefore has a low joining strength. While soldering, molding or testing the chip, the crystallized inter-metallic compound 102 may break, hence deteriorating the yield rate and product reliability as well.

SUMMARY OF THE INVENTION

The invention is directed to an under bump metallurgy structure and a wafer structure using the same and a method of manufacturing the wafer structure. The adhesion layer in the under bump metallurgy structure is made of nickel with boron, so as to strengthen the connecting point and further improve product reliability and quality.

According to a first aspect of the present invention, an under bump metallurgy structure including an adhesion layer, a barrier layer and a wetting layer is provided. The adhesion layer disposed on a bonding pad of a wafer is made of nickel with boron. The barrier layer disposed on the adhesion layer is made of cobalt. The wetting layer disposed on the barrier layer is made of gold.

According to a second aspect of the present invention, a wafer structure including a wafer, a bonding pad, a passivation layer and an under bump metallurgy structure is provided. The bonding pad is disposed on the wafer. The passivation layer covers the wafer and exposes a part of the bonding pad. The under bump metallurgy structure includes an adhesion layer, a barrier layer and a wetting layer. The adhesion layer disposed on the bonding pad is made of nickel with boron. The barrier layer disposed on the adhesion layer is made of cobalt. The wetting layer disposed on the barrier layer is made of gold.

According to a third aspect of the present invention, a method of manufacturing wafer structure is provided. First, a wafer whose surface has a bonding pad and is covered by a passivation layer is provided. The passivation layer exposes a part of the bonding pad. Next, an adhesion layer made of nickel with boron is electroless plated onto the bonding pad. Then, a barrier layer made of cobalt is electroless plated onto the adhesion layer. After that, a wetting layer made of gold is formed on the barrier layer.

The invention will become apparent from the following detailed description of the preferred but non-limiting embodiments. The following description is made with reference to the accompanying drawings.

DETAILED DESCRIPTION OF THE INVENTION

Figure 1:
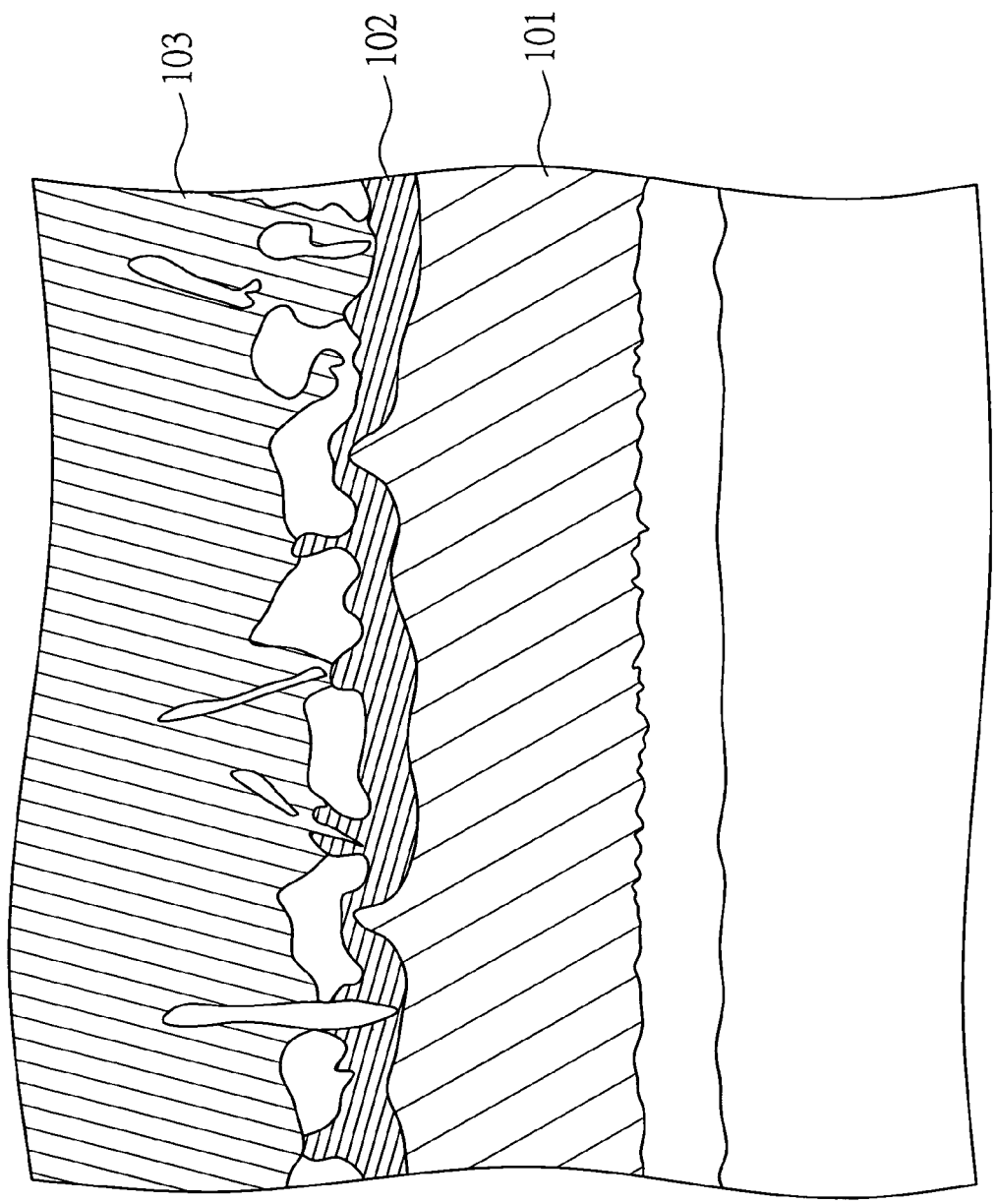
FIG. 1 is a perspective of a interface between a bump and an electroless plating nickel layer from the prior art.

The invention is exemplified by a preferred embodiment below. However, the embodiment is for purpose of exemplification and is not for limiting the scope of protection of the invention, and the embodiment is accorded with the appended claims. Furthermore, unnecessary elements are omitted in the drawings of the embodiment, so as to highlight the technical characteristics of the invention.

The wafer structure according to a preferred embodiment of the invention includes a wafer, a bonding pad, a passivation layer and an under bump metallurgy structure. In the present embodiment of the invention, the bonding pad is located on the surface of the wafer, and the passivation layer covers the surface of the wafer and exposes a part of the bonding pad. The under bump metallurgy structure disposed on the bonding pad includes an adhesion layer, a barrier layer and a wetting layer. A method of manufacturing wafer structure according to a preferred embodiment of the invention is disclosed below.

Figure 2A:
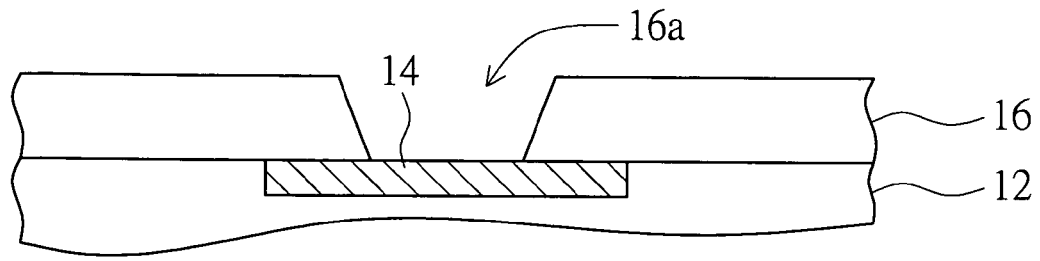
FIG. 2A is a perspective of a wafer according to a preferred embodiment of the invention.
Figure 2B:
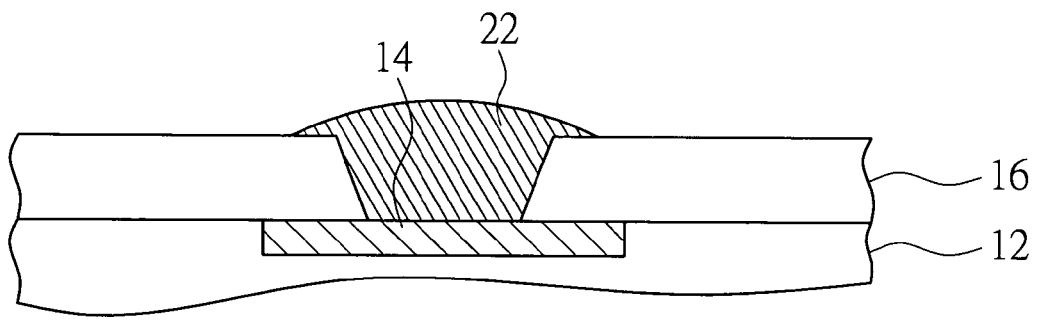
FIG. 2B is a perspective of an adhesion layer formed on the wafer in FIG. 2A.
Figure 2C:
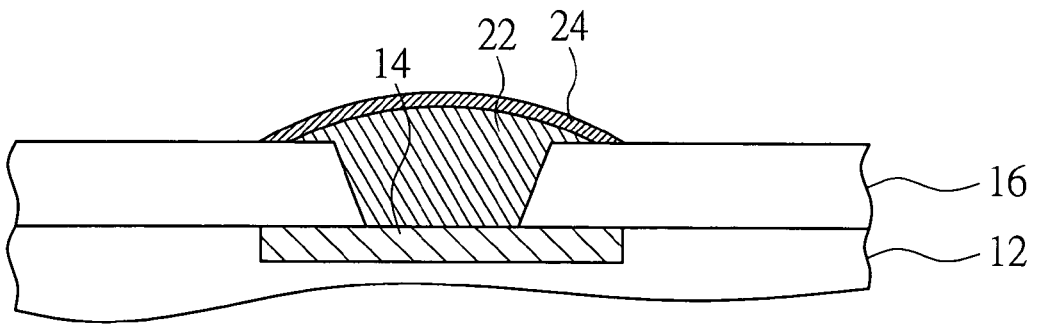
FIG. 2C is a perspective of a barrier layer formed on the adhesion layer in FIG. 2B.
Figure 2D:
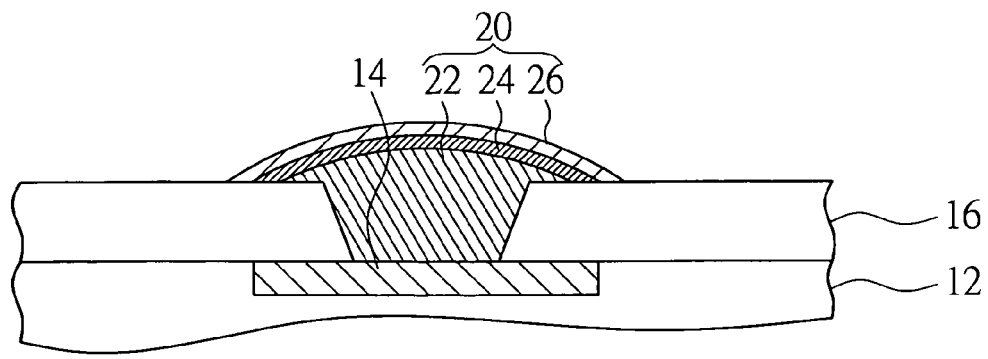
FIG. 2D is a perspective of a wetting layer formed on the barrier layer in FIG. 2C.
Figure 2E:
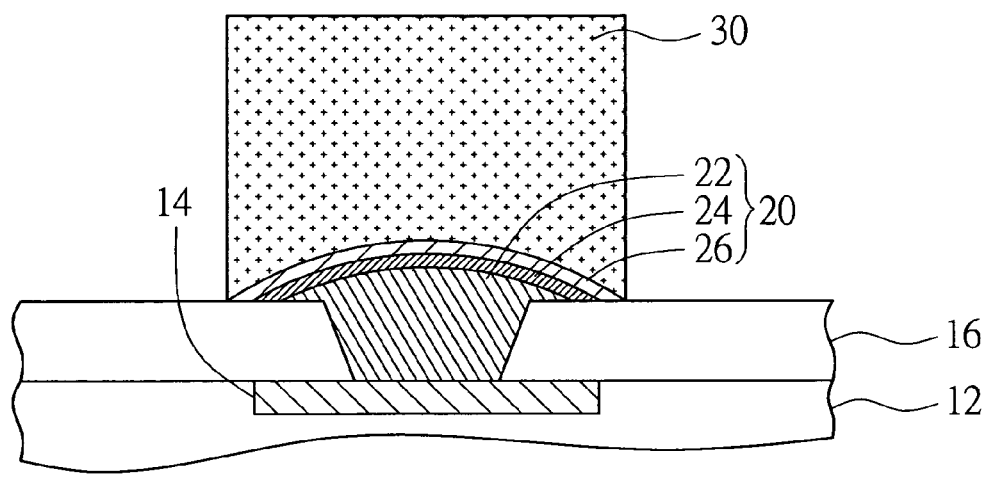
FIG. 2E is a perspective of a solder layer formed on the wetting layer in FIG. 2D.

Referring to FIGS. 2A~2E. FIG. 2A is a perspective of a wafer according to a preferred embodiment of the invention. FIG. 2B is a perspective of an adhesion layer formed on the wafer in FIG. 2A. FIG. 2C is a perspective of a barrier layer formed on the adhesion layer in FIG. 2B. FIG. 2D is a perspective of a wetting layer formed on the barrier layer in FIG. 2C. FIG. 2E is a perspective of a solder layer formed on the wetting layer in FIG. 2D. The method of manufacturing wafer structure according to a preferred embodiment of the invention includes the following steps. First, a wafer 12 is provided, as indicated in FIG. 2A. In the present embodiment of the invention, the wafer 12 is preferably a silicon wafer, whose surface has a bonding pad 14 and a passivation layer 16. The bonding pad 14 is made of copper or aluminum for example and is used as an electrical connecting point on the wafer 12. The passivation layer 16 covers the wafer 12 and has an opening 16a that exposes a part of the bonding pad 14.

Next, an adhesion layer 22 is electroless plated onto the bonding pad 14. Preferably, the surface of the bonding pad 14 is treated prior to the step of electroless plating the adhesion layer 22. For example, oxidie (such as copper oxide), organic or inorganic materials are removed from the surface of the bonding pad 14. Then the surface of the bonding pad 14 is activated by zinc or cobalt. Afterwards, the wafer 12 is immersed in the plating bath of nickel boron for electroless plating the adhesion layer 22. In the present embodiment of the invention, nickel with boron (Ni—B) is precipitated onto the surface of the activated bonding pad 14 through the autocatalytic reaction of nickel metal in the electroless plating bath. The material layer of nickel boron layer formed here is the adhesion layer 22 with a thickness approximately 1~15 µm.

Next, as indicated in FIG. 2C, a barrier layer 24 is electroless plated onto the adhesion layer 22 for preventing the diffusion of the nickel metal of the adhesion layer 22. In the present embodiment of the invention, the thickness of the barrier layer 24 is approximately 0.15~7.5 µm, and is preferably made of cobalt (Co). Compared with palladium, cobalt not only takes lower material cost but also enhances the electrical contact quality between the bonding pad 14 and the bump formed in subsequent manufacturing process.

Then, as indicated in FIG. 2D, a wetting layer 26 is formed on the barrier layer 24. The wetting layer 26 prevents the barrier layer 24 from being oxidized and improves the wetting ability of the bump. In the present embodiment of the invention, the wetting layer 26 is made of gold (Au), and is preferably electroless plated onto the barrier layer 24 with a thickness approximately equal to 0.05~0.15 µm. However, the wetting layer 26 can also be immersion plated onto the barrier layer 24. After the wetting layer 26 is formed, the adhesion layer 22, the barrier layer 24 and the wetting layer 26 constitute an under bump metallurgy (UBM) structure 20.

Afterwards, a solder layer 30 is formed on the wetting layer 26 as indicated in FIG. 2E. In the present embodiment of the invention, the solder layer 30 is printed onto the wetting layer 26, and the solder layer 30 can be made of tin (Sn), lead (Pb), nickel, gold, silver (Ag), copper or combinations thereof.

Then, the method of manufacturing wafer structure proceeds to the step of reflowing the solder layer 30 to form a bump. Any one who is skilled in the technology field of the invention will understand that the manner of forming the bump is not limited to the printing and the reflowing method disclosed above. For example, the bump can be formed on the under bump metallurgy structure by way of directly ball placement. The step of directly ball placement can be performed by a ball placement machine or a robot arm which directly places the bump onto the under bump metallurgy structure. Then the bump is bonded onto the under bump metallurgy structure with flux. In another embodiment, the bump can be aligned by a stencil and then placed on the under bump metallurgy structure correspondingly. After that, the bump is bonded onto the under bump metallurgy structure with flux. Other commonly used methods for bonding the bump onto the under bump metallurgy structure can also be used in the present embodiment of the invention.

Figure 3:
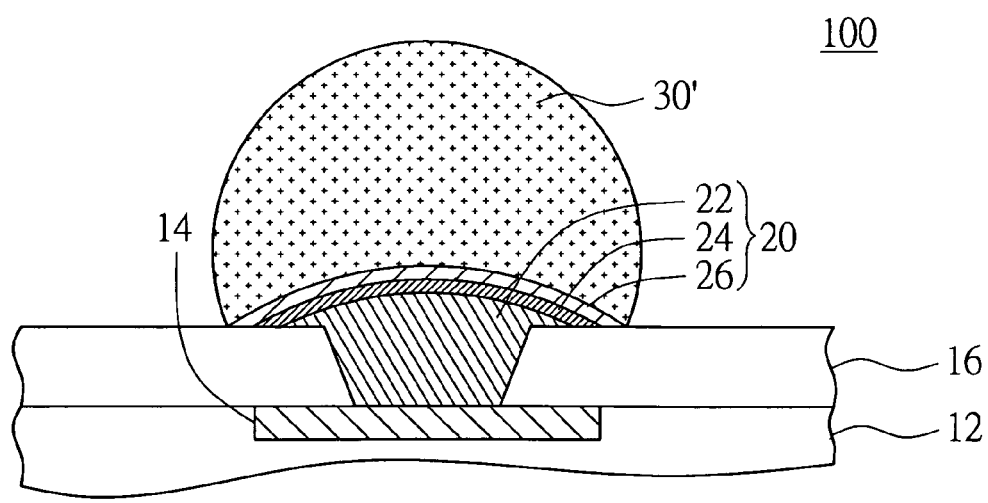
FIG. 3 is a perspective of a wafer structure according to a preferred embodiment of the invention.

After the bump is formed, the wafer structure according to a preferred embodiment of the invention is completed. Referring to FIG. 3, a perspective of a wafer structure according to a preferred embodiment of the invention is shown. The wafer structure 100 includes a wafer 12, a bonding pad 14, a passivation layer 16, an under bump metallurgy structure 20 and a bump 30'. The under bump metallurgy structure 20 includes an adhesion layer 22, a barrier layer 24 and a wetting layer 26.

In the present embodiment of the invention, the adhesion layer 22, the barrier layer 24 and the wetting layer 26 are all electroless plated layers. Whilst electroless plating these layers in the plating bath, these layers are formed with substantially the same width. Besides, of the under bump metallurgy structure 20, the adhesion layer 22 is made of nickel with boron, so that when related heat treatment process applies to the wafer structure 100 (for example, reflowing the solder layer 30 to form the bump 30'), the formation of the cyrstallised phosphorous-rich inter-metallic compound between the bump 30' and the bonding pad 14 can be suppressed. Please refer to attachment 2 at the same time, a photo of scanning electron microscopy of the interface between an under bump metallurgy structure and a bump according to a preferred embodiment of the invention is shown. According to the experiment and analysis results, no brittle crystalised phosphorous-rich inter-metallic compound is formed between the under bump metallurgy structure 20 and the bump 30', and the joint surface is a smooth structure. Such that the bonding property of the under bump metallurgy structure 20 and the bump 30' is enhanced, and the bonding stability between the bump 30' and the bonding pad 14 is further improved.

Compared with the conventional barrier layer of palladium, the barrier layer 24 of cobalt in the present embodiment lowers the material cost. Further, according to the experiment results, the thin layer resistance of the conventional under bump metallurgy structure made of nickel/palladium/gold structure is greater than the under bump metallurgy structure made of nickel/cobalt/gold structure by 8.6%. Therefore, compared with the conventional barrier layer made of palladium, the barrier layer 24 made of cobalt in the present embodiment of the invention has better electrical properties.

On the other hand, the method of manufacturing wafer structure according to the present embodiment is exemplified by forming one under bump metallurgy structure 20 on one bonding pad 14. However, in practical applications, the surface of the wafer 12 is preferably provided with an array of many bonding pads 14, and many under bump metallurgy structures 20 are formed on the bonding pad 14 according to a wafer level manufacturing process before sawing the wafer 12. The method of manufacturing wafer structure according to the present embodiment can be utilized in wafer level chip size package (WLCSP) technology and flip chip package technology.

According to the under bump metallurgy structure and the wafer structure using the same and the method of manufacturing the wafer structure disclosed in the above embodiment of the invention, the adhesion layer, the barrier layer and the wetting layer are respectively made of nickel with boron, cobalt and gold, suppressing the brittle inter-metallic compound between the bump and the bonding pad from being formed during heat treatment processes. Therefore, the mechanical strength of the connecting point is enhanced, and the product reliability is improved. Further, as the adhesion layer, the barrier layer and the wetting layer are formed by way of electroless plating, manufacturing process steps and cost are reduced. Moreover, compared with the conventional barrier layer of palladium, the barrier layer of cobalt in the embodiment of the invention not only reducing material cost but also improving electrical properties.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An under bump metallurgy (UBM) structure, comprising:
    an adhesion layer disposed on a bonding pad of a wafer, wherein the adhesion layer is made of nickel with boron (Ni—B);
    a barrier layer disposed on the adhesion layer, wherein the barrier layer is made of cobalt (Co); and
    a wetting layer disposed on the barrier layer, wherein the wetting layer is made of gold (Au).

2. The under bump metallurgy structure according to claim 1, wherein the adhesion layer and the barrier layer are electroless plated layers individually.

3. The under bump metallurgy structure according to claim 1, wherein the wetting layer is an electroless plated layer or an immersion plated layer.

4. The under bump metallurgy structure according to claim 1, wherein the thickness of the adhesion layer is approximately 1~15 μm.

5. The under bump metallurgy structure according to claim 1, wherein the thickness of the barrier layer is approximately 0.15~7.5 μm.

6. The under bump metallurgy structure according to claim 1, wherein the thickness of the wetting layer is approximately 0.05~0.15 μm.

7. A wafer structure, comprising:
    a wafer;
    a bonding pad disposed on the wafer;
    a passivation layer covering the wafer and exposing a part of the bonding pad; and
    an under bump metallurgy structure, comprising:
        an adhesion layer disposed on the bonding pad, wherein the adhesion layer is made of nickel with boron;
        a barrier layer disposed on the adhesion layer, wherein the barrier layer is made of cobalt; and
        a wetting layer disposed on the barrier layer, wherein the wetting layer is made of gold.

8. The wafer structure according to claim 7, wherein the adhesion layer and the barrier layer are electroless plated layers individually.

9. The wafer structure according to claim 7, wherein the wetting layer is an electroless plated layer or an immersion plated layer.

10. The wafer structure according to claim 7, wherein the thickness of the adhesion layer is approximately 1~15 μm.

11. The wafer structure according to claim 7, wherein the thickness of the barrier layer is approximately 0.15~7.5 μm.

12. The wafer structure according to claim 7, wherein the thickness of the wetting layer is approximately 0.05 ~0.15 μm.

13. The wafer structure according to claim 7, wherein the structure further comprising:
    a bump disposed on the wetting layer.

* * * * *